United States Patent
Laurent et al.

(10) Patent No.: US 12,248,027 B2
(45) Date of Patent: Mar. 11, 2025

(54) METHOD FOR DETERMINING THE VALUE OF A PARAMETER RELATED TO THE STATE OF HEALTH OF AN ELECTROCHEMICAL CELL IN A BATTERY, SYSTEM FOR ELECTRONIC MANAGEMENT OF A BATTERY, AND CORRESPONDING BATTERY

(71) Applicant: SAFT, Levallois-Perret (FR)

(72) Inventors: Sebastien Laurent, Merignac (FR);
Nathalie Legrand, Burges (FR);
Sebastien Benjamin, Leognan (FR);
Cedric Gousset, Bordeaux (FR)

(73) Assignee: SAFT, Levallois-Perret (FR)

( * ) Notice: Subject to any disclaimer, the term of this patent is extended or adjusted under 35 U.S.C. 154(b) by 233 days.

(21) Appl. No.: 17/787,022

(22) PCT Filed: Dec. 17, 2020

(86) PCT No.: PCT/EP2020/086888
§ 371 (c)(1),
(2) Date: Jun. 17, 2022

(87) PCT Pub. No.: WO2021/123063
PCT Pub. Date: Jun. 24, 2021

(65) Prior Publication Data
US 2023/0032837 A1 Feb. 2, 2023

(30) Foreign Application Priority Data
Dec. 20, 2019 (FR) ........................................ 1915283

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3842* (2019.01); *G01R 31/389* (2019.01); *H02J 7/0048* (2020.01)

(58) Field of Classification Search
CPC ................ G01R 31/392; G01R 31/389; G01R 31/3842; G01R 31/367; H02J 7/0048
See application file for complete search history.

(56) References Cited

U.S. PATENT DOCUMENTS

| 5,830,595 A | * | 11/1998 | Song | G01R 31/3648 |
| | | | | 429/91 |
| 9,766,298 B2 | * | 9/2017 | Lennevi | G01R 31/382 |

(Continued)

FOREIGN PATENT DOCUMENTS

DE  11 2016 006 166 T5  9/2018

OTHER PUBLICATIONS

International Search Report for PCT/EP2020/086888 dated Mar. 15, 2021 [PCT/ISA/210].

*Primary Examiner* — Walter L Lindsay, Jr.
*Assistant Examiner* — Milton Gonzalez
(74) *Attorney, Agent, or Firm* — Sughrue Mion, PLLC

(57) ABSTRACT

The invention relates to a method for determining the value of one or more parameters relating to the state of health of at least one accumulator of a battery that is intended to provide electrical energy to an external application. A first state-of-health parameter related to the resistance of at least one electrochemical element of the battery is determined according to the method comprising: —a step (1) of determining the value of the state of charge of the electrochemical element, expressed as a percentage of a maximum state of charge; —a step (2) of verifying whether the determined value of the state of charge belongs to a sought range; —a step of repeating, as long as the result of the verification step (2) is not positive, the determination step (1) and then the (Continued)

verification step (2); —calculating the value of the first parameter as a function of at least the value of the state of charge determined during the last determination step (1).

10 Claims, 1 Drawing Sheet

(51) Int. Cl.
*G01R 31/3842* (2019.01)
*G01R 31/389* (2019.01)
*H02J 7/00* (2006.01)

(56) References Cited

U.S. PATENT DOCUMENTS

| | | | |
|---|---|---|---|
| 2008/0103709 A1 | 5/2008 | Yun et al. | |
| 2010/0001693 A1 | 1/2010 | Iida et al. | |
| 2016/0097819 A1* | 4/2016 | Ohkawa | G01R 31/389 324/430 |
| 2016/0370431 A1 | 12/2016 | Sejima et al. | |
| 2018/0236891 A1 | 8/2018 | Suzuki et al. | |
| 2019/0067954 A1* | 2/2019 | Ohkawa | B60L 58/12 |
| 2019/0334213 A1 | 10/2019 | Kodama | |

* cited by examiner

METHOD FOR DETERMINING THE VALUE OF A PARAMETER RELATED TO THE STATE OF HEALTH OF AN ELECTROCHEMICAL CELL IN A BATTERY, SYSTEM FOR ELECTRONIC MANAGEMENT OF A BATTERY, AND CORRESPONDING BATTERY

CROSS REFERENCE TO RELATED APPLICATIONS

This application is a National Stage of International Application No. PCT/EP2020/086888 filed Dec. 17, 2020, claiming priority based on French Patent Application No. FR1915283 filed Dec. 20, 2019.

FIELD OF THE INVENTION

The present invention relates to a method for determining the value of one or more parameters reflecting state of health of at least one cell of a battery intended to supply electric energy to an external application. The invention also relates to an electronic management system for a battery implementing this method, as well as to a battery equipped with this system.

BACKGROUND ART

In the present description, for the sake of simplification, the less precise expression "determination of a parameter" is sometimes used in place of the expression "determination of the value of a parameter" but designates the same operation.

Typically, a battery comprises one or more storage cells also called electrochemical generators, electrochemical cells or secondary cells. A storage cell is an electricity generating device in which chemical energy is converted into electric energy. The chemical energy originates from the electrochemically active compounds present on the electrodes of the storage cell. The electric energy is produced by electrochemical reactions during discharge of the storage cell. The electrodes, arranged in a container, are electrically connected to current output terminals which provide electric continuity between the electrodes and an electric consumer to which the storage cell is associated.

In order to increase the electric power delivered, a plurality of sealed storage cells may be associated with each other to form a battery. Thus, a battery can be divided into modules, each module being composed of one or more storage cells connected together in series and/or in parallel. Thus, a battery may for example comprise one or more parallel branches of storage cells connected in series and/or one or more parallel branches of modules connected in series.

A charging circuit is generally provided to which the battery can be connected to recharge the storage cells.

An electronic management system comprising measurement sensors and an electronic control circuit, of a greater or lesser degree of sophistication according to the applications can furthermore be associated with the battery. Such a system makes it possible in particular to organize and control the charging and discharge of the battery, to balance the charge and discharge of the various storage cells of the battery with respect to one another.

State of Health (SOH) is information useful to the electronic system for managing the battery to optimize its use and its service life. It makes it possible to estimate ageing of the battery between a new state and an end-of-life state, or more generally, between an initial state and a final state.

One so-called static method for determining the SOH of a battery comprises monitoring the temperature, voltage, and possibly current values of the battery in order to determine a SOH value on the basis of ageing laws. These ageing laws are obtained from tests carried out in the laboratory. A SOH algorithm then gives an estimate of the ageing of the battery. However, this mode of determining the SOH of the battery is subject to an assumption of homogeneous ageing of the cells of the battery. A mode of determining SOH by a predictive model also assumes a power circuit that is not impacted by a failure between the storage cells.

Another so-called dynamic method for determining SOH of a battery consists in calculating the ratio of resistance of the battery at a given instant to the resistance of the battery in its new or initial state under the same measurement conditions (in particular under the same temperature conditions). Resistance increases in effect with ageing of the battery, resulting in a loss of power. This is then described as State of Health, SOH related to resistance ($SOH_R$: State of Health related to battery resistance).

SOH can also be calculated from the ratio of the capacity of the battery at a given time to the capacity of the battery in the new or initial state under the same measurement conditions (in particular under the same temperature conditions). Capacity decreases in effect with ageing, resulting in loss of available energy. This is described as State of Health, SOH related to capacity of the battery ($SOH_Q$: State of Health related to battery capacity).

Depending on the size of the battery and/or according to the application, a SOH calculation can be provided for the battery overall or for each module, or for each cell of a module.

Depending on their nature, certain electrochemical cells have a no-load voltage curve as a function of state of charge which exhibits wide plateau regions, as shown in FIG. 1. This is the case, for example, with electrochemical cells of the $LiFePO_4$ or $LiMnFePO_4$ type.

From a system point of view, the major difficulty in managing these cells rests in the existence of the plateau in the zone 2-3 of FIG. 1. In this region, calculations that are possible are limited because it is not possible to accurately associate a state of charge with a voltage measurement.

For this type of cell, it is possible, for example, to determine ageing in capacity on the occasion of a complete discharge during a maintenance cycle.

Another method for determining ageing in capacity is to observe variations in the deformation of the cell over a partial cycle.

However, these methods do not make it possible to determine ageing related to resistance of a battery.

It is also known to characterize resistance using a step in current. This solution involves measuring the ratio between voltage variation and current variation. However, such a solution requires a specific additional cycle, and therefore is not possible in a native mode because it requires, for example, a charger with significant pulse capacity, which imposes a constraint on the user.

In addition, such a solution is difficult to reproduce in practice because pulse time, state of charge value at the moment the pulse is applied, as well as pulse current are as many variables which influence measurement of resistance.

Moreover, even if this solution were to be feasible and reproducible, evolution of the chemical properties of the cell with ageing involves a modification of certain internal parameters such as time constants for example. Also, this solution does not make it possible to give significant information on actual ageing. As a result, ageing often gets minimized when resistance is estimated from the transition region of a current step.

SUMMARY OF THE INVENTION

Thus, the aim of the invention is to solve, in particular, the aforementioned problems, by providing a method for determining the value of a parameter reflecting state of health of an electrochemical cell in a battery, such as resistance, which is accurate and which does not require any additional supply of a pulse or specific action on the part of the user, in particular in the case of electrochemical cells whose open circuit voltage curve as a function of state of charge has a plateau region as explained above.

The invention therefore provides, according to a first aspect, a method for determining a value of a first parameter (R) reflecting state of health which is related to resistance of at least one electrochemical cell of a battery, said electrochemical cell being of the type having a curve for state of charge which represents open circuit voltage (OCV) at the terminals of the electrochemical cell as a function of state of charge (SOC) expressed as a percentage of a maximum state of charge, at least one determined portion of said curve being substantially flat or said curve comprising at least one determined portion in which there is substantially not a one-to-one relationship between state of charge (SOC) and open circuit voltage (OCV), the method comprising the steps of:
  determining a value for state of charge (SOC) of the electrochemical cell, expressed as a percentage of a maximum state of charge, or a value of electric charge (Ah) of the electrochemical cell;
  verifying whether the determined value for state of charge (SOC) falls within a region of interest ([$SOC_{min}$, $SOC_{max}$]) having a lower bound $SOC_{min}$, and an upper bound $SOC_{max}$, or whether the determined value of electric charge (Ah) falls within an extended region ([$Ah_{min\_et}$, $Ah_{max\_et}$]) having a lower bound $Ah_{min\_et}$ and an upper bound $Ah_{max\_et}$ determined from the lower bound $SOC_{min}$, and the upper bound $SOC_{max}$ of the region of interest ([$SOC_{min}$, $SOC_{max}$]), the region of interest ([$SOC_{min}$, $SOC_{max}$]) corresponding to a portion of the curve representing state of charge that is included in the determined portion;
  repeating, as long as a result of said verification step is not positive, said determination step and then said verification step;
  calculating a value of said first parameter (R) as a function of at least a value of state of charge (SOC) determined during the last step of determination.

In some embodiments, the method further comprises one or more of the following features, taken alone or following all technically possible combinations:
  prior to at least the first determination step, a value of electric capacity C of the electrochemical cell is determined, and at least one of said determination steps is a step of determining an SOC value for state of charge (SOC) and comprises the steps of:
  performing the following calculation: SOC=1-Ah/C, where Ah is electric charge of the electrochemical cell expressed in Ampere-hour under discharge of said electrochemical cell; or performing the following calculation: SOC=Ah/C, where Ah is electric charge of the electrochemical cell expressed in Ampere-hour under charge of said electrochemical cell;
  the first parameter is a resistance (R) of the electrochemical cell, and the step of calculating a value R of resistance (R) comprises carrying out the following calculation: R=(U-OCV)/I, where U and I are respective voltage and current values at the terminals of the electrochemical cell, and OCV is a value of open circuit voltage (OCV), OCV being a function of a value for state of charge (SOC) determined in corresponding determination step;
  the OCV value is determined from a table associating values for state of charge (SOC) with values for open circuit voltage (OCV);
  the OCV value is a constant value of no-load voltage over the region of interest [$SOC_{min}$, $SOC_{max}$] for state of charge values;
  the step of calculating a value R of resistance (R) comprises repeating the calculation (U-OCV)/I for several SOC values for state of charge (SOC) within the region of interest ([$SOC_{min}$, $SOC_{max}$]), and calculating an average of the results of said calculation (U-OCV)/I;
  prior to the step of determining a value of state of charge (SOC):
    a step of determining a value of the electric charge (Ah) of the electrochemical cell and then a step of verifying whether the determined value of the electric charge (Ah) falls within extended region ([$Ah_{min\_et}$, $Ah_{max\_et}$]) are carried out, and
    as long as the result of the step of verifying whether the determined value of the electric charge (Ah) falls within an extended region ([$Ah_{min\_et}$, $Ah_{max\_et}$]) is not positive, the step of determining a value of the electric charge is repeated (Ah) followed by said verification step;
  the lower bound $Ah_{min\_et}$ and the upper bound $Ah_{max\_et}$ of the extended region ([$Ah_{min\_et}$, $Ah_{max\_et}$]) of electric charge values (Ah) are determined from the lower bound $SOC_{min\_et}$ and the upper bound $SOC_{max}$ of the region of interest ([$SOC_{min}$, $SOC_{max}$]) of values of state of charge;
  the lower bound $Ah_{min\_et}$ of the extended region ([$Ah_{min\_et}$, $Ah_{max\_et}$]) of electric charge values (Ah) is obtained from the region of interest ([$SOC_{min}$, $SOC_{max}$]) of values of state of charge by implementing the following calculation:
  under discharge of the electrochemical cell, $Ah_{min\_et}$=C×(1-$SOC_{max}$); or
  under charge of the electrochemical cell, $Ah_{min\_et}$=C×$SOC_{min}$,
  where C is a minimum attainable capacity of the electrochemical cell;
  the upper bound $Ah_{max\_et}$ of the extended region ([$Ah_{min\_et}$, $Ah_{max\_et}$]) of electric charge values (Ah) is obtained from the region of interest ([$SOC_{min}$, $SOC_{max}$]) of values for state of charge by carrying out the following calculation:
  under discharge of the electrochemical cell, $Ah_{max\_et}$=C×(1-$SOC_{min}$); or
  under charge of the electrochemical cell, $Ah_{max\_et}$=C×$SOC_{max}$, where C is the nominal capacity of the electrochemical cell.
  the first parameter is a resistance (R) of the electrochemical cell, and comprising the steps for each determined value Ah of electric charge (Ah) of:

determining a resistance R value (R) using the following calculation: R=(U−OCV)/I, where U and I are respective voltage and current values at the terminals of the electrochemical cell, and OCV is a value for open circuit voltage (OCV), OCV being a function of the determined value Ah of electric charge (Ah), and storing this resistance value (R) in a resistance value table;

OCV is determined from a table associating values for state of charge (SOC) with values for open circuit voltage (OCV), each value for state of charge (SOC) being associated with a value of the first parameter (Ah);

the OCV value is the constant value of no-load voltage over the region of interest a ([$SOC_{min}$, $SOC_{max}$], of state of charge values;

the step of calculating a value R of the resistance (R) comprises repeating the implementation of the calculation (U−OCV)/I for several values Ah of the electric parameter (Ah) comprised in the extended region ([$Ah_{min\_et}$, $Ah_{max\_et}$]);

a value for electric capacity C of the electrochemical cell is determined, and a value of a first parameter (R) reflecting state of health which is related to resistance is determined from resistance values in the resistance table, for which a value Ah of electric charge in said table falls within a region of interest ([$Ah_{min}$, $Ah_{max}$]) of electric charge corresponding to the region of interest ([$SOC_{min}$, $SOC_{max}$]) of values for state of charge;

the lower bound $Ah_{min}$ and the upper bound $Ah_{max}$ of the region of interest ([$Ah_{min}$, $Ah_{max}$]) of electric charge values (Ah) are determined from the lower bound $SOC_{min}$ and the upper bound $SOC_{max}$ of the region of interest ([$SOC_{min}$, $SOC_{max}$]) of values for state of charge.

the lower bound $Ah_{min}$ of the region of interest ([$Ah_{min}$, $Ah_{max}$]) of electric charge values (Ah) is obtained from the region of interest ([$SOC_{min}$, $SOC_{max}$]) of values for state of charge by carrying out the following calculation:

under discharge of the electrochemical cell, $Ah_{min}$=C×(1−$SOC_{max}$); or under charge of the electrochemical cell, $Ah_{min}$=C×$SOC_{min}$, where C is the determined capacity of the electrochemical cell.

the upper bound $Ah_{max}$ of the region of interest ([$Ah_{min}$, $Ah_{max}$]) of electric charge values (Ah) is obtained from the region of interest ([$SOC_{min}$, $SOC_{max}$]) of values for state of charge by carrying out the following calculation:

under discharge of the electrochemical cell, $Ah_{min}$=C×(1−$SOC_{min}$); or under charge of the electrochemical cell, $Ah_{min}$=C×$SOC_{max}$, where C is the determined capacity of the electrochemical cell.

state of charge (SOC) is expressed as a percentage of maximum state of charge, and the region of interest ([$SOC_{min}$, $SOC_{max}$]) of values for state of charge (SOC) is comprised in the interval [44%, 60%], preferably [46%, 58%].

the first parameter is a resistance (R) of the electrochemical cell, and the method comprises a step of determining a value of a second parameter (SOHR) reflecting state of health which is related to resistance of the electrochemical cell as a function of a value R of the determined resistance (R);

the step of determining a value of the second parameter (SOHR) comprises a step of determining a first value $R_{init}$ of resistance (R) as a function of a temperature and/or current value, from a table associating temperature and/or current values, with resistance values;

the SOHR value of the second parameter (SOHR) is determined according to the following calculation: SOHR=R/$R_{init}$.

In a second aspect, the invention provides an electronic battery management system comprising at least one electrochemical cell, the system comprising:

means for measuring at least voltage (U) and current (I), at the terminals of said electrochemical cell, under charge or discharge of said electrochemical cell;

a microprocessor programmed to carry out the above method.

The invention also provides, according to a third aspect, a battery comprising at least one electrochemical cell, and at least one electronic management system as disclosed above.

The method of the invention thus enables reliable estimation of resistance of an electrochemical cell, without specific action on the part of the user, in the presence of a plateau region in the curve of open circuit voltage as a function of state of charge corresponding to this electrochemical cell.

BRIEF DESCRIPTION OF THE DRAWINGS

The features and advantages of the invention will become apparent upon reading the description which follows, given solely by way of example, and non-limiting, with reference to the following appended drawings.

DETAILED DESCRIPTION OF EMBODIMENTS

The method of the invention is described below on the basis of two particular embodiments.

It is a question of determining a value of a first parameter reflecting state of health which is related to the resistance of at least one electrochemical cell of a battery. In the two above-mentioned embodiments, the first parameter reflecting state of health which is related to resistance of the electrochemical cell in question is the resistance itself of this electrochemical cell.

Figure 1:
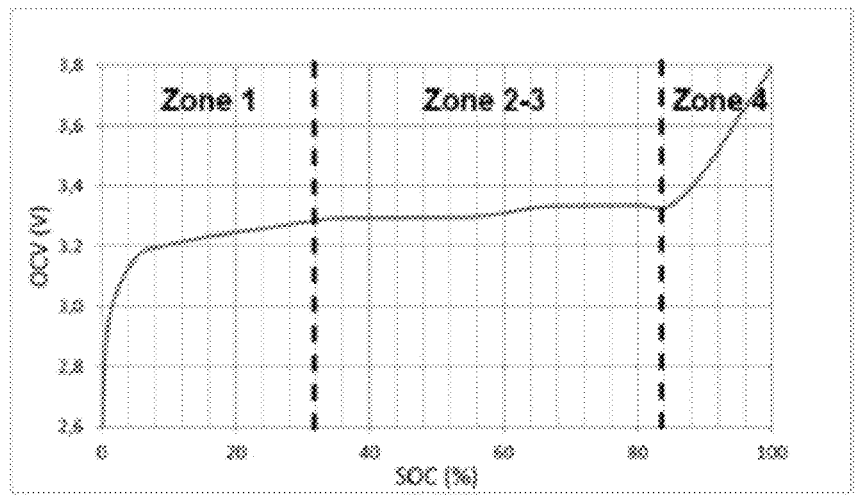
FIG. 1 graphically shows the curve of open circuit voltage as a function of state of charge of an electrochemical cell of the $LiFePO_4$ type.

As can be seen in the example of FIG. 1, the electrochemical cell concerned is of the type having an open circuit voltage curve of which at least one determined portion is substantially flat or which exhibits a determined portion in which there is substantially not a one-to-one relationship between state of charge, SOC, and open circuit voltage, OCV.

It will be recalled that the open circuit voltage curve of an electrochemical cell graphically represents open circuit voltage OCV at the terminals of the electrochemical cell, depending on state of charge, SOC expressed as a percentage of a maximum state of charge.

Such a curve is shown in FIG. 1, with in zone 2-3, a substantially flat determined portion in which there is substantially not a one-to-one relationship between state of charge, SOC and open circuit voltage, OCV.

In this zone 2-3 corresponding to the determined portion of the curve, it is not possible to accurately associate a state of charge with a voltage measurement. Indeed, for one single voltage value on the y-axis (plus or minus a tiny margin) there can be a number of values of state of charge (on the x-axis).

Figure 2:
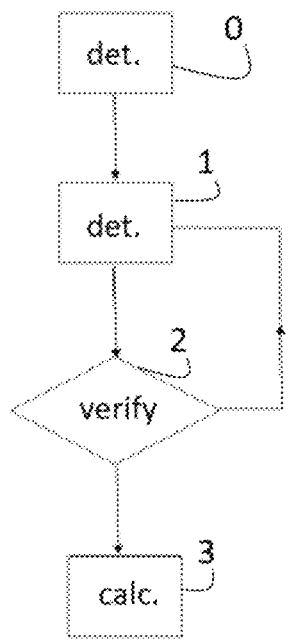
FIG. 2 shows the steps of the method according to the invention diagrammatically.

As shown schematically in FIG. 2, the method essentially comprises a determination step (1) and a verification step (2).

Step (1) is a step of determining a value of state of charge, SOC of the electrochemical cell, SOC being expressed as a percentage of a maximum state of charge. Alternatively, this step (1) is a step of determining a value of the electric charge Ah of the electrochemical cell.

Step (2) is a step of verifying whether the determined value falls within a particular interval of values, referred to as the region of interest [$SOC_{min}$, $SOC_{max}$] when it is a question of determination of state of charge, SOC at determination step (1), or falls within an extended region [$Ah_{min\_et}$, $Ah_{max\_et}$] when it is a question of determination of electric charge Ah in determination step (1).

The region of interest ([$SOC_{min}$, $SOC_{max}$]) corresponds to a portion of the open circuit voltage curve included in the determined portion.

Determination step (1) followed by verification step (2) are repeated as long as the result of verification step (2) is not positive, i.e. as long as a value determined in determination step (1) is not included in the corresponding interval ([$SOC_{min}$, $SOC_{max}$]) or [$Ah_{min\_et}$, $Ah_{max\_et}$].

Then, in a calculation step (3), a value of said first parameter R is calculated as a function of at least a value of the state of charge SOC, or a value of the electric charge Ah, determined in the last determination step (1).

Prior to the step (1) of determining a value of state of charge SOC or of the electric charge Ah, as will be seen subsequently, a value of the electric capacity C of the electrochemical cell is preferably determined (0).

In a first embodiment, the successive determination step(s) (1) are steps of determining the SOC value of state of charge (SOC). This SOC value is then calculated as follows:

SOC=1-Ah/C, where Ah is the electric charge of the electrochemical cell expressed in Ampere-hour under discharge of this electrochemical cell;

Or

SOC=Ah/C, where Ah is the electric charge of the electrochemical cell expressed in Ampere-hour under charge of this electrochemical cell.

Furthermore, as the first parameter, the value of which is to be determined, is the resistance of the electrochemical cell as indicated above, a value R for resistance calculated in the calculation step (3) is obtained as follows:

R=(U-OCV)/I

In this calculation, U and I are the respective voltage and current values at the terminals of the electrochemical cell, and OCV is the open circuit voltage value. OCV is a function of the SOC value for state of charge determined in the corresponding determination step (1).

More specifically, the OCV value is determined from a table that associates SOC values of SOC with open-circuit voltage OCV values. The OCV value may also be the constant value of open circuit voltage over the region of interest [$SOC_{min}$, $SOC_{max}$] for values of state of charge of the electrochemical cell.

It is also possible to choose to determine a value of R as being the average of several values of resistances determined by the calculation (U-OCV)/I presented above, for several values of state of charge, SOC comprised in the interval [$SOC_{min}$, $SOC_{max}$] referred to as the region of interest.

In a second embodiment, the successive determination step(s) (1) are steps of determining a value Ah of the electric charge.

In this embodiment, the lower bound $Ah_{min\_et}$ and the upper bound $Ah_{max\_et}$ of the interval [$Ah_{min\_et}$, $Ah_{max\_et}$] of values for electric charge Ah, referred to as the extended region, are determined from the lower bound $SOC_{min\_et}$ the upper bound $SOC_{max}$ of the region of interest [$SOC_{min}$, $SOC_{max}$] of values of state of charge.

More specifically, the lower bound $Ah_{min\_et}$ of the extended region [$Ah_{min\_et}$, $Ah_{max\_et}$] is obtained as follows:

under discharge of the electrochemical cell, $Ah_{min\_et}$=C×(1-$SOC_{max}$);

or under charge of the electrochemical cell, $Ah_{min\_et}$=C×$SOC_{min}$.

In this calculation, C is the minimum reachable capacity of the electrochemical cell.

Furthermore, the upper bound $Ah_{max\_et}$ of the extended region [$Ah_{min\_et}$, $Ah_{max\_et}$] is obtained as follows:

under discharge of the electrochemical cell, $Ah_{max\_et}$=C×(1-$SOC_{min}$);

or under charge of the electrochemical cell, $Ah_{max\_et}$=C×$SOC_{max}$.

In this calculation, C is the nominal capacity of the electrochemical cell.

Then, as the first parameter the value of which it is a question of determining is the resistance of the electrochemical cell as indicated above, a value R of the resistance calculated in the calculation step (3) is obtained as explained below.

For each determined value Ah of electric charge (Ah), a resistance value R is determined and this resistance value R is stored in a resistance value table.

The calculation of resistance R values is carried out as follows: R=(U-OCV)/I.

In this calculation, U and I are the respective voltage and current values at the terminals of the electrochemical cell, and OCV is the value of open circuit voltage.

The OCV value is a function of the determined value Ah of electric charge.

More specifically, the OCV value is determined from a table associating state of charge, SOC values with open circuit voltage OCV values, each state of charge, SOC value being further associated with a value Ah of state of charge.

The OCV value may also be the constant value of open circuit voltage over the region of interest [$SOC_{min}$, $SOC_{max}$] for values of state of charge of the electrochemical cell.

In this embodiment, it is necessary to predetermine a value of capacity C in order to apply the remainder of the method. This capacity can be determined by any means known to a person skilled in the art (examples: constant current charge or discharge).

Preferably, for this calculation of the resistance R value, the resistance values stored in the aforementioned resistance table are used, for which it has been verified that the associated electric charge Ah value in said table does fall within a region of interest [$Ah_{min}$, $Ah_{max}$] of electric charge, this region of interest corresponding to the region of interest [$SOC_{min}$, $SOC_{max}$] of values of state of charge.

Thus, the lower bound $Ah_{min}$ and the upper bound $Ah_{max}$ of the region of interest [$Ah_{min}$, $Ah_{max}$] are determined from the lower bound $SOC_{min}$ and from the upper bound $SOC_{max}$ of the region of interest [$SOC_{min}$, $SOC_{max}$].

More specifically, the lower bound Ahmin of the region of interest [Ahmin, Ahmax] is obtained by the following calculation:

under discharge of the electrochemical cell, Ahmin=C× (1−SOCmax);

or under charge of the electrochemical cell, Ahmin=C× $SOC_{min}$.

Furthermore, the upper bound $Ah_{max}$ of the region of interest [$Ah_{min}$, $Ah_{max}$] is obtained by the following calculation:

under discharge of the electrochemical cell, $Ah_{max}$=C× (1-$SOC_{min}$);

Or under charge of the electrochemical cell, $Ah_{max}$=C× $SOC_{max}$.

In all embodiments, the applicant has determined that the region of interest for the values of state of charge, SOC, expressed as a percentage of a maximum state of charge, comprised in the interval [44%, 60%], preferably [46%, 58%], gave very good results in terms of accuracy of determination of a value of the parameter reflecting state of health which is related to resistance of the electrochemical cell of the battery, in other words the value of the resistance itself.

Also, in all embodiments, the value of a second parameter SOHR reflecting state of health which is related to resistance of the electrochemical cell is determined as a function of a value R of the determined resistance.

To do this, a first value $R_{init}$ of the resistance is determined as a function of a temperature and/or current value. For this purpose, a table associating temperature and/or current values with resistance values is used.

Then, the value of SOHR of the second parameter is obtained as follows: SOHR=R/$R_{init}$.

Thus, the impact of temperature or current on the calculation can be decorrelated.

The method of the invention is particularly suitable for situations in which the electrochemical cell concerned is of the type having an open-circuit voltage curve of which at least one portion is substantially flat or having a portion in which the relationship between state of charge SOC and open circuit voltage OCV is substantially not a one-to-one relationship, as shown in FIG. 1.

The method of the invention can be implemented by programming a microprocessor of an electronic management system for a battery comprising at least one electrochemical cell. Such a system further comprises means for measuring at least the voltage U and the current I, at the terminals of the electrochemical cell (s), under charging or discharge of the electrochemical cell(s), to allow the microprocessor to carry out the steps of the method.

A battery comprising at least one electrochemical cell, and at least one electronic management system as presented above, enables efficient and accurate monitoring of its actual ageing, despite notably the modifications of certain internal parameters inherent in ageing, by means of an efficient and accurate determination of resistance R.

The present description is given by way of example and is not limiting of the invention.

In particular, the invention is not limited to the two specific embodiments presented by way of example. It is based on the use of an interval of values of state of charge [$SOC_{min}$, $SOC_{max}$], referred to as the region of interest of state of charge, or of an interval of electric charge values [$Ah_{min\_et}$, $Ah_{max\_et}$], whose lower and upper bounds are related, as seen above, to the lower and upper bounds of the state of charge region of interest, the region of interest [$SOC_{min}$, $SOC_{max}$] being included in the plateau region of an open circuit voltage curve, i.e. the determined portion of this curve which is substantially flat, or a determined portion in which there is substantially not a one-to-one relationship between state of charge, SOC and open circuit voltage, OCV. The two above-mentioned embodiments give two examples of the type of calculation which make it possible to obtain the desired resistance value R.

The invention claimed is:

1. A method for determining, without use of current pulses, a resistance, R, of at least one electrochemical cell of a battery, the resistance R reflecting a state of health, SOH, of the electrochemical cell, the electrochemical cell being of an $LiFePO_4$ type or an $LiMnFePO_4$ type exhibiting a value of open circuit voltage, OCV, which for the $LiFePO_4$ type or an $LiMnFePO_4$ type of the electrochemical cell, is constant regardless of a degree of ageing of the electrochemical cell and consequently of the state of health, SOH, over a unique region of interest [$SOC_{min}$, $SOC_{max}$] of state of charge, SOC, having a lower bound $SOC_{min}$ and an upper bound $SOC_{max}$ and being comprised in an interval [44%, 60%], which is from 44% to 60% inclusive, of SOC of the at least one electrochemical cell, the method comprising the steps of:

initially providing a table associating values for the state of charge, SOC, with values for the open circuit voltage, OCV, of said at least one electrochemical cell, each value, of the values, for the state of charge, SOC, being associated with a value for an electric charge, Ah, determining, in a first determination step, a value of electric capacity, C, of the at least one electrochemical cell, determining in a second determination step a value, of the values, for the state of charge, SOC, of the electrochemical cell, expressed as a percentage of a maximum state of charge from at least one of:

a relation SOC=1−Ah/C, where Ah is the electric charge of the at least one electrochemical cell expressed in Ampere-hour under discharge of said electrochemical cell, and a relation SOC=Ah/C, where Ah is electric charge of the at least one electrochemical cell expressed in Ampere-hour under charge of said electrochemical cell, implementing a verification step comprising determining: whether the determined value for the state of charge, SOC, falls within said unique region of interest ([$SOC_{min}$, $SOC_{max}$]) comprised in the interval [44%, 60%] of SOC, and repeating, as long as a result of said verification step is not positive, the first determination step, the second determination step, and the verification step; and calculating a value of the resistance, R, using a relation R=(U−OCV)/I, where U and I are respective voltage and current values at the terminals of the at least one electrochemical cell, and, in the relation, the OCV is a constant value of the open circuit voltage, OCV, over the region of interest [$SOC_{min}$, $SOC_{max}$], taken from said table associating values for the state of charge, SOC, with the values for the open circuit voltage, OCV.

2. The method according to claim 1, wherein calculating the value R of resistance comprises repeating a calculation of (U−OCV)/I for several SOC values for the state of charge (SOC), within the region of interest, ([$SOC_{min}$, $SOC_{max}$]), and calculating an average of results of said calculation (U−OCV)/I.

3. The method according to claim 1, further comprising storing the resistance value, R, in a resistance value table.

4. The method according to claim 1, wherein the region of interest, [$SOC_{min}$, $SOC_{max}$], of values for state of charge, SOC, is comprised in the interval [46%, 58%].

5. The method according to claim 1, further comprising a step of determining a value reflecting state of health, $SOH_R$, as a function of a value R of the determined resistance.

6. The method according to claim 5, wherein the step of determining the value reflecting the state of health, $SOH_R$ comprises a step of determining a first value $R_{init}$ of resistance, R, as a function of temperature and/or current, from a table associating temperature and/or current values, with resistance values.

7. The method according to claim 6, wherein the value reflecting the state of health, $SOH_R$, is determined according to the following calculation: $SOH_R = R/R_{init}$.

8. An electronic battery management system comprising at least one electrochemical cell, the system comprising:
means for measuring at least voltage, U, and current, I, at the terminals of said electrochemical cell, under charge or discharge of said electrochemical cell;
a microprocessor programmed to carry out the method according to claim 1.

9. A method for determining, without use of current pulses, a value $SOH_R$ for state of health, SOH, related to resistance, R, of at least one electrochemical cell of a battery, the electrochemical cell being of an $LiFePO_4$ type or an $LiMnFePO_4$ type exhibiting a value of open circuit voltage, OCV, which for the $LiFePO_4$ type or an $LiMnFePO_4$ type of the electrochemical cell, is constant regardless of a degree of ageing of the electrochemical cell and consequently of the state of health, SOH, over a unique region of interest [$SOC_{min}$, $SOC_{max}$] of state of charge, SOC, having a lower bound $SOC_{min}$ and an upper bound $SOC_{max}$ and being comprised in an interval [44%, 60%], which is from 44% to 60% inclusive, of SOC of the at least one electrochemical cell, said method comprising the steps of:
providing a table associating values for the state of charge, SOC, with values for the open circuit voltage, OCV of said at least one electrochemical cell,
determining, in a first determination step, a value of electric capacity, C, of the at least one electrochemical cell,
determining in a second determination step a value, of the values, for the state of charge, SOC, of the electrochemical cell, SOC from at least one of:
a relation SOC=1−Ah/C, where Ah is the electric charge of the at least one electrochemical cell expressed in Ampere-hour under discharge of said electrochemical cell, and
a relation SOC=Ah/C, where Ah is electric charge of the electrochemical cell expressed in Ampere-hour under charge of said electrochemical cell,
implementing a verification step comprising determining:
whether the determined value for the state of charge, SOC, falls within said unique region of interest ([$SOC_{min}$, $SOC_{max}$]) comprised in the interval [44%, 60%] of SOC, and
repeating, as long as a result of said verification step is not positive, the first determination step, the second determination step, and the verification step;
calculating a value of the resistance, R, using a relation R=(U−OCV)/I, where U and I are respective voltage and current values at the terminals of the at least one electrochemical cell, and, in the relation, the OCV is a constant value of the open circuit voltage, OCV, over the region of interest [$SOC_{min}$, $SOC_{max}$], taken from said table associating values for the state of charge, SOC, with the values for the open circuit voltage, OCV,
providing a table associating temperature and/or current values, with resistance values within said region of interest [$SOC_{min}$, $SOC_{max}$] of state of charge comprised in the interval [44%, 60%] of SOC of the at least one electrochemical cell,
determining an initial value $R_{init}$ of resistance, R, as a function of temperature and/or current, from said table associating temperature and/or current values, with resistance values within said region of interest [$SOC_{min}$, $SOC_{max}$] of state of charge comprised in the interval [44%, 60%] of SOC of the at least one electrochemical cell; and
determining the state of health related to resistance, $SOH_R$, using the following calculation: $SOH_R = R/R_{init}$.

10. The method according to claim 9, wherein the region of interest, [$SOC_{min}$, $SOC_{max}$], of the values for state of charge, SOC, is comprised in the interval [46%, 58%].

* * * * *